United States Patent
Kim et al.

(10) Patent No.: US 7,528,668 B2
(45) Date of Patent: May 5, 2009

(54) DIFFERENTIAL AMPLIFIER, DIFFERENTIAL AMPLIFYING METHOD, AND PHASE LOCKED LOOP AND DELAY LOCKED LOOP USING THE SAME

(75) Inventors: Jin-Young Kim, Seoul (KR); Kyu-Hyoun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 162 days.

(21) Appl. No.: 11/594,448

(22) Filed: Nov. 8, 2006

(65) Prior Publication Data

US 2007/0109058 A1   May 17, 2007

(30) Foreign Application Priority Data

Nov. 14, 2005   (KR) .................... 10-2005-0108576

(51) Int. Cl.
  *H03K 5/04*   (2006.01)
  *H03B 1/00*   (2006.01)
  *H03L 7/08*   (2006.01)

(52) U.S. Cl. ............................. 331/45; 331/74; 331/57; 331/60; 327/156; 327/175; 327/359; 330/252

(58) Field of Classification Search .................. 331/45, 331/57, 60, 74, 34; 327/156, 157, 158, 171, 327/175, 269, 271, 296, 298, 355, 359; 330/295, 330/113, 124 R, 252

See application file for complete search history.

(56) References Cited

U.S. PATENT DOCUMENTS

| 5,463,353 | A | 10/1995 | Countryman et al. |
| 5,572,158 | A * | 11/1996 | Lee et al. ..................... 327/175 |
| 5,673,008 | A | 9/1997 | Sumita |
| 6,542,015 | B2 * | 4/2003 | Zhou et al. ................... 327/172 |
| 6,963,235 | B2 * | 11/2005 | Lee ............................ 327/158 |
| 7,319,345 | B2 * | 1/2008 | Farjad-rad et al. ............. 327/99 |

FOREIGN PATENT DOCUMENTS

| JP | 08-088565 | 4/1996 |
| JP | 09-036708 | 2/1997 |
| JP | 11-041070 | 2/1999 |

\* cited by examiner

*Primary Examiner*—Robert Pascal
*Assistant Examiner*—Ryan J. Johnson
(74) *Attorney, Agent, or Firm*—Mills & Onello, LLP

(57) ABSTRACT

A differential amplifier includes an input stage, a biasing unit and a load unit. The input stage receives a first phase signal and at least two phase signals among odd-numbered phase signals, wherein an average of phases of the at least two phase signals has a phase difference of substantially 180 degrees from the first phase signal. The biasing unit is coupled between the input stage and a first power voltage. The load unit is coupled between the input stage and a second power voltage, and configured to output a differential output signal based on differentially amplifying of the first phase signal and the at least two phase signals. Therefore, a duty cycle distortion in an output signal of a duty cycle correction circuit can be prevented.

24 Claims, 11 Drawing Sheets

DIFFERENTIAL AMPLIFIER, DIFFERENTIAL AMPLIFYING METHOD, AND PHASE LOCKED LOOP AND DELAY LOCKED LOOP USING THE SAME

CROSS-REFERENCE TO RELATED APPLICATIONS

This application claims priority under 35 USC § 119 to Korean Patent Application No. 10-2005-0108576, filed on Nov. 14, 2005, in the Korean Intellectual Property Office, the contents of which are herein incorporated by reference in its entirety.

BACKGROUND OF THE INVENTION

1. Field of the Invention

The present invention relates to a differential amplifier used in a phase locked loop (PLL) and a delay locked loop (DLL).

2. Description of the Related Art

In a phase locked loop (PLL), a complementary metal oxide silicon (CMOS) differential amplifier is used to convert a small signal outputted from a voltage controlled oscillator (VCO) to a signal having a level used in a CMOS circuit. The CMOS differential amplifier receives a differential input signal having a phase difference of 180 degrees.

Two phase signals are selected among a plurality of phase signals outputted from the voltage-controlled oscillator (VCO) and amplified by the CMOS differential amplifier. The amplified output signal of the CMOS differential amplifier is provided to a duty cycle correction (DCC) circuit to correct the duty cycle thereof. The DCC circuit is employed in the PLL or a delayed locked loop (DLL) to adjust a duty cycle of the output signal of the PLL or DLL to 50%

To prevent duty cycle distortion in an output signal of the DCC circuit, which corresponds to the output signal of the CMOS differential amplifier, the output signal of the CMOS differential amplifier that is inputted to the DCC circuit is preferred to have a duty cycle of approximately 50%. Therefore, the signals inputted to the CMOS differential amplifier is preferred to be a differential signal having a phase difference of 180 degrees from each other.

When even-numbered phase signals are outputted from the VCO and the even-numbered phase signals respectively have, for example, a phase of 0 degrees, a phase of 90 degrees, a phase of 180 degrees and a phase of 270 degrees, among the even-numbered phase signals, two phase signals having a phase difference of 180 degrees (e.g., a phase signal having a phase of 90 degrees and a phase signal having a phase of 270 degrees) can be provided as differential input signals of the CMOS differential amplifier.

FIG. 1 is a block diagram illustrating a conventional voltage-controlled oscillator (VCO) that outputs odd-numbered phase signals.

Referring to FIG. 1, odd-numbered phase signals, for example, five phase signals including a phase signal "a" having a phase of 0 degrees, a phase signal "b" having a phase of 72 degrees, a phase signal "c" having a phase of 144 degrees, a phase signal "d" having a phase of 216 degrees and a phase signal "e" having a phase of 288 degrees are outputted from respective CMOS inverter amplifiers 10 of the VCO.

In the VCO, the phase difference between two phase signals that are inputted to the respective CMOS differential amplifiers 20 is not 180 degrees. Accordingly, although the output signal of the CMOS differential amplifier 20 is provided to the DCC circuit 30 to correct the duty cycle thereof, the duty cycle of an output signal of the DCC circuit 30, which corresponds to the output signal of the CMOS differential amplifier 20, can be distorted.

In addition, when using a phase interpolation circuit to provide differential signals having a phase difference of 180 degrees using odd-numbered phase signals outputted from the VCO, power consumption can be increased and a load of the VCO can be increased by the interpolation circuit.

SUMMARY OF THE INVENTION

Example embodiments of a differential amplifier in accordance with aspects of the present invention can reduce a duty cycle distortion in an output signal of a duty cycle correction circuit, and can be used in a phase locked loop (PLL) or a delay locked loop (DLL) apparatus or circuit.

Therefore, in accordance with various aspects of the present invention a phase locked loop having the above differential amplifier can be provided.

And in accordance with various aspects of the present invention, a delay locked loop having the above differential amplifier can be provided.

And in accordance with various aspects of the present invention, a differential amplifying method can be provided that can reduce a duty cycle distortion in an output signal of a duty cycle correction circuit used, for example, in a phase locked loop (PLL) or a delay locked loop (DLL).

In accordance with one aspect of the present invention, provided is a differential amplifier that includes an input stage configured to receive a first phase signal and at least two phase signals among a set of odd-numbered phase signals, wherein an average phase of the at least two phase signals has a phase difference of substantially 180 degrees from the first phase signal; a biasing unit coupled between the input stage and a first power voltage; and a load unit coupled between the input stage and a second power voltage, the load unit is configured to output a differential output signal based on differentially amplifying of the first phase signal and the at least two phase signals.

The differential amplifier can be a CMOS differential amplifier.

The CMOS differential amplifier can form part of a phase locked loop (PLL) circuit.

The PLL circuit can include a voltage controlled oscillator and the set of odd-numbered phase signals can be output from the voltage-controlled oscillator.

The CMOS differential amplifier can form part of a delay locked loop (DLL) circuit.

The DLL circuit can include a voltage-controlled delay line and the set of odd-numbered phase signals can be output signals from the voltage-controlled delay line.

In the differential amplifier, the at least two phase signals can include a second phase signal and a third phase signal, and the input stage can comprise: a first transistor configured to receive the first phase signal; a second transistor configured to receive the second phase signal; and a third transistor configured to receive the third phase signal.

The input stage can further comprise: a fourth transistor configured to receive a first output signal of a duty cycle correction circuit; and a fifth transistor configured to receive a second output signal of the duty cycle correction circuit.

The input stage can further comprise a sixth transistor configured to receive the first phase signal.

In the differential amplifier, a phase difference between two adjacent phase signals among the set of odd-numbered phase signals can be a value obtained by dividing 360 degrees by a number of phase signals in the set of odd-numbered signals, and the phases of the second phase signal and the third phase signal can be the two closest phases to a phase obtained by adding 180 degrees to a phase of the first phase signal.

In accordance with another aspect of the present invention, provided is a differential amplifier configured to amplify a first phase signal and at least two phase signals among a set of odd-numbered phase signals, wherein an average of phases of the at least two phase signals has a phase difference of substantially 180 degrees from the first phase signal.

The differential amplifier can be a CMOS differential amplifier.

The at least two phase signals can comprise a second phase signal and a third phase signal, and the differential amplifier can comprise an input stage having first, second and third transistors respectively configured to receive the first, second and third phase signals.

In the differential amplifier, a phase difference between two adjacent phase signals among the odd-numbered phase signals can be a value obtained by dividing 360 degrees by the number of phase signals in the set of odd numbered phase signals, and the phases of the second and third phase signals can be the two closest phases to a phase obtained by adding 180 degrees to a phase of the first phase signal.

In accordance with another aspect of the present invention, provided is a phase locked loop apparatus comprising: a phase frequency detector configured to generate a phase difference signal based on a phase difference between an input signal and a feedback signal; a charge pump configured to generate a current signal based on the phase difference signal of the phase frequency detector; a loop filter configured to generate a control voltage signal based on the current signal; a voltage-controlled oscillator configured to generate a plurality of phase signals having frequencies that vary according to a voltage level of the control voltage signal; a differential amplifier configured to amplify a first phase signal and at least two phase signals among the plurality of the phase signals, wherein an average of phases of the at least two phase signals has a phase difference of substantially 180 degrees from the first phase signal; a duty cycle correction circuit configured to correct a duty cycle of an output signal of the differential amplifier; and a frequency divider configured to generate the feedback signal by dividing an output signal of the duty cycle correction circuit with a predetermined ratio.

In the phase locked loop apparatus, the differential amplifier can be a CMOS differential amplifier, and the plurality of phase signals can be a set of odd-numbered phase signals.

The at least two phase signals can include a second phase signal and a third phase signal, and the differential amplifier can include an input stage having a first, a second and a third transistors respectively receiving the first, second and third phase signals.

The differential amplifier can be configured such that a phase difference between two adjacent phase signals among the set of odd-numbered phase signals is a value obtained by dividing 360 degrees by the number of phase signals in the set of odd-numbered phase signals, and the phases of the second signal and the third phase signal are the two closest phases to a phase obtained by adding 180 degrees to a phase of the first phase signal.

In accordance with still another aspect of the present invention, provided is a delay locked loop apparatus comprising: a phase frequency detector configured to generate a phase difference signal based on a phase difference between an input signal and a feedback signal; a charge pump configured to generate a current signal based on the phase difference signal of the phase frequency detector; a loop filter configured to generate a control voltage signal based on the current signal; a voltage-controlled delay line configured to generate a plurality of delay signals by delaying the input signal by a predetermined interval based on the control voltage signal; a differential amplifier configured to amplify a first phase signal and at least two phase signals among the plurality of the delay signals, wherein an average of phases of the at least two phase signals has a phase difference of substantially 180 degrees from the first phase signal; a duty cycle correction circuit configured to correct a duty cycle of an output signal of the differential amplifier; and a delayer configured to generate the feedback signal by delaying an output signal of the duty cycle correction circuit.

In accordance with still another aspect of the present invention, provided is a differential amplifying method that can include: receiving a first phase signal and at least two phase signals among a set of odd-numbered phase signals, wherein an average of phases of the at least two phase signals has a phase difference of substantially 180 degrees from the first phase signal; outputting a differentially amplified output signal based on differentially amplifying the first phase signal and the at least two phase signals; and correcting a duty cycle of the differentially amplified output signal.

As a result, the output signal of the duty cycle correction circuit can have a duty cycle of substantially 50:50 (i.e., 50%), and thus a duty cycle distortion of the output signal of the duty cycle correction circuit can be prevented.

BRIEF DESCRIPTION OF THE DRAWINGS

Various aspects of the invention will become more apparent in view of the attached drawing figures, which are provided by way of example, not by way of limitation, in which.

DESCRIPTION OF THE EMBODIMENTS

Figure 1:
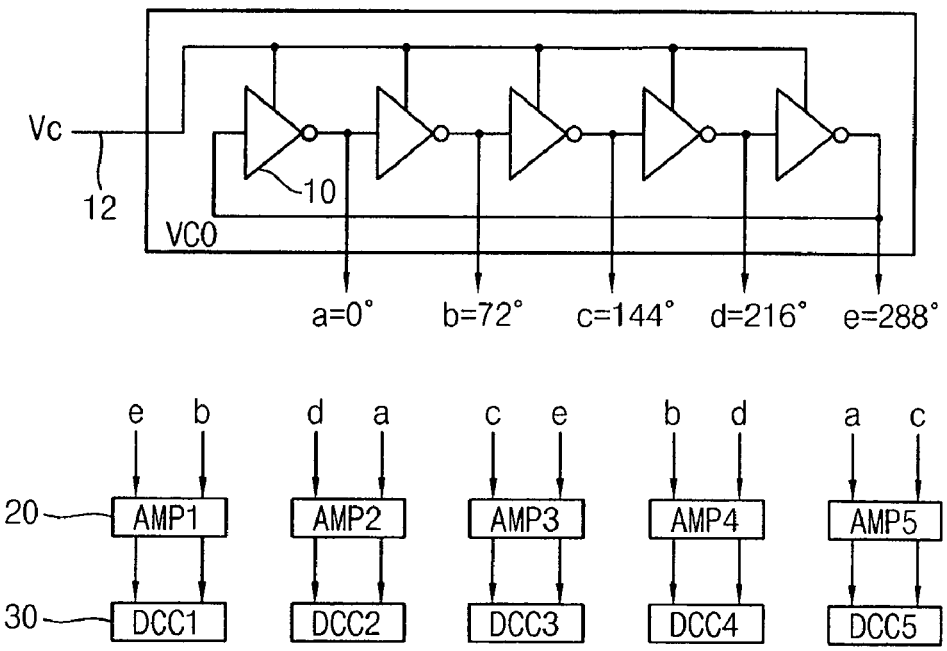
FIG. 1 is a block diagram illustrating a conventional voltage-controlled oscillator (VCO) that outputs odd-numbered phase signals.

Hereinafter, illustrative embodiments in accordance with various aspects of the present invention are discribed with reference to the accompanying drawings, wherein like elements are given like reference numerals.

It will be understood that, although the terms first, second, etc. can be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on," "connected" or "coupled" to another element, it can, be directly on, connected or coupled to the other element or intervening elements can be present. In contrast, when an element is referred to as being "directly on," "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprise," "comprises," "comprising," "include," "includes" and/or "including" when used herein, specify the presence of stated features, integers, steps, operations, elements, and/or components, but do not preclude the presence or addition of one or more other features, integers, steps, operations, elements, components, and/or groups thereof.

Figure 2:
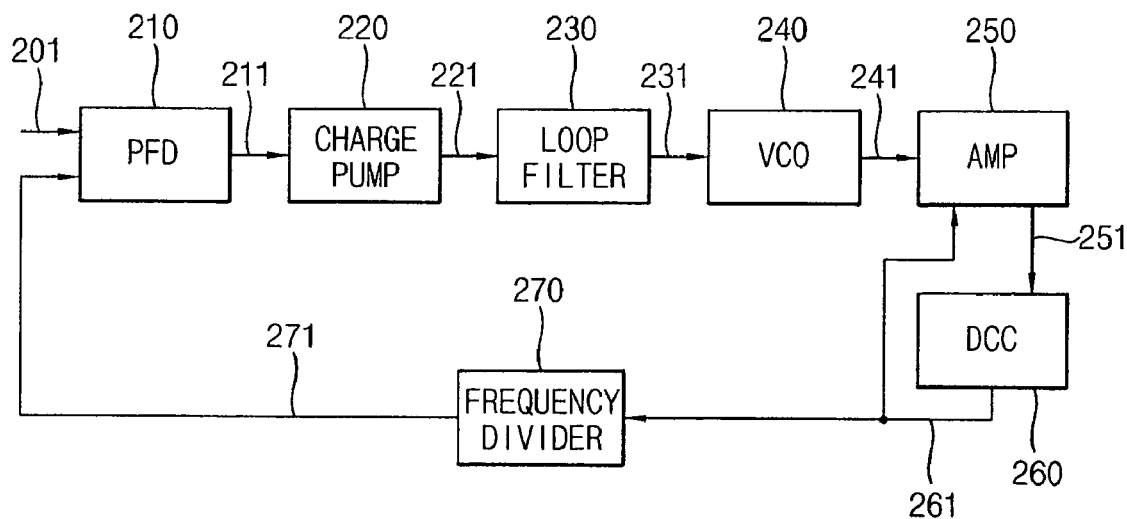
FIG. 2 is a block diagram illustrating an embodiment of a phase locked loop (PLL) according to aspects of the present invention.

FIG. 2 is a block diagram illustrating an embodiment of a phase locked loop (PLL) apparatus or circuit according to aspects of the present invention.

Referring to FIG. 2, the PLL includes a phase frequency detector (PFD) 210, a charge pump 220, a loop filter 230, a voltage-controlled oscillator (VCO) 240 and a frequency divider 270.

The phase frequency detector 210 compares a phase of an input signal 201 and a phase of a feedback signal 271 to generate a phase difference signal 211 containing information on a phase difference between the input signal 201 and the feedback signal 271. The phase difference signal 211 can be an up signal (UP) or a down signal (DN) to the charge pump 220.

The charge pump 220 generates a current signal 221 based on the phase difference between the input signal 201 and the feedback signal 271 using the phase difference signal 211 provided from the PFD 210. The loop filter 230 generates a control voltage signal 231 based on the current signal 221.

The voltage-controlled oscillator 240 generates an oscillation signal 241 having a frequency varying according to a voltage level of the control voltage signal 231. The oscillation signal 241 can include a plurality of signals having different phases from one another. The voltage-controlled oscillator 240 can be implemented, for example, as an oscillator, a ring oscillator or an L-C tank circuit, etc. As a ring oscillator, voltage-controlled oscillator 240 can include a plurality of inverter delay cells (e.g., CMOS inverter amplifiers), respective ones of which have a feedback loop and collectively they form a ring structure, wherein an output of a preceding inverter delay cell is an input of a following inverter delay cell, thereby constructing a ring structure. The ring oscillator can further include an inverter that inverts an output of the ring oscillator.

The PLL can further include a differential amplifier 250 and a duty cycle correction (DCC) circuit 260. For example, the differential amplifier 250 can be a CMOS differential amplifier that amplifies a voltage swing of the oscillation signal 241 of the VCO 240 to convert the oscillation signal 241 to a signal having a level used in a CMOS circuit. The DCC circuit 260 is used to adjust a duty cycle of an output signal 251 of the differential amplifier 250 to 50:50 (i.e., 50%).

The frequency divider 270 receives an output signal 261 of the DCC circuit 260 to divide the output signal 261 with a predetermined ratio, and then provides a feedback signal 271 to the PFD 210.

The phase locked loop according to an example embodiment of the present disclosure can be suitable for applications where the voltage-controlled oscillator outputs odd-numbered phase signals, for example, three, five or seven phase signals having different phases from one another.

Figure 3:
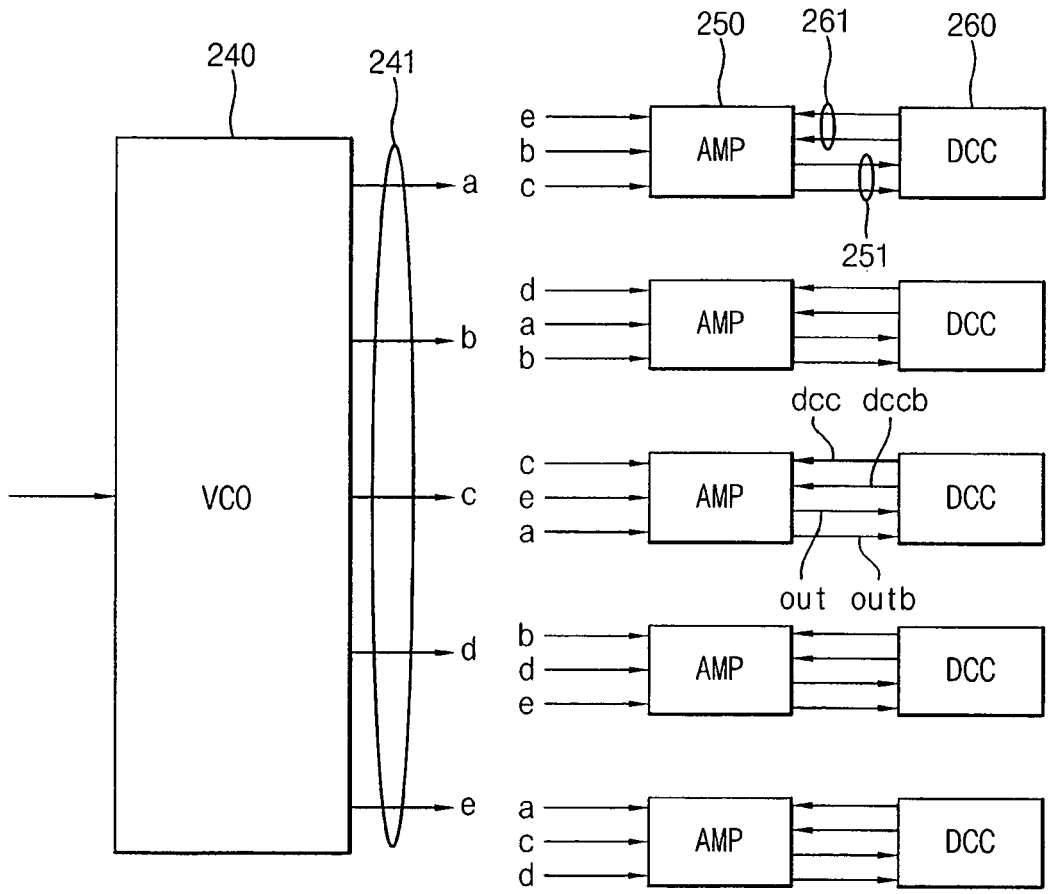
FIG. 3 is a block diagram illustrating an embodiment of a voltage-controlled oscillator that outputs five phase signals according to aspects of the present invention.
Figure 4:
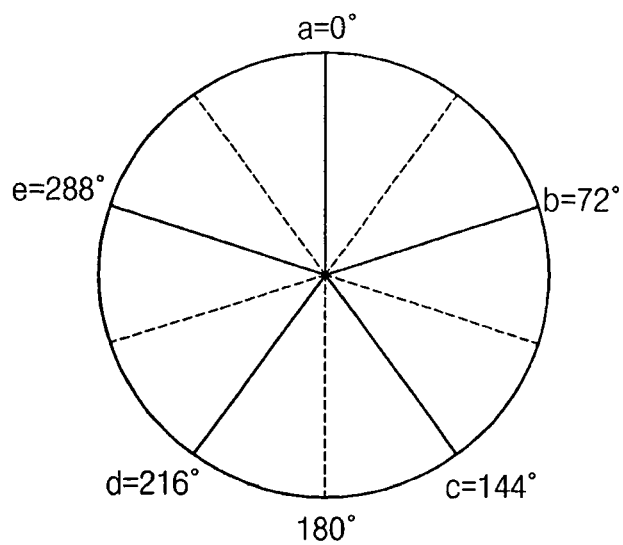
FIG. 4 is a schematic view illustrating a phase of an output signal of an embodiment of a voltage-controlled oscillator according to aspects of the present invention.

FIG. 3 is a block diagram illustrating an embodiment of a voltage-controlled oscillator that outputs five phase signals and FIG. 4 is a schematic view illustrating a phase of an output signal of a voltage-controlled oscillator of FIG. 3, for example.

Referring to FIG. 3, the voltage-controlled oscillator 240 outputs five phase signals a, b, c, d, and e to corresponding differential amplifiers 250. For example, the phase signal a can have a phase of substantially 0 degrees, the phase signal b can have a phase of substantially 72 degrees, the phase signal c can have a phase of substantially 144 degrees, the phase signal d can have a phase of substantially 216 degrees and the phase signal e can have a phase of substantially 288 degrees.

Each if the differential amplifiers 250 receives and amplifies three of the above phase signals to provide an amplified output signal 251 to the DCC circuit 260. A duty cycle of a corresponding output signal 261 of the corresponding DCC circuit 260 is corrected, and then the output signal 261 is provided back to the corresponding differential amplifier 250.

First through third phase signals inputted to the respective differential amplifiers 250 are selected such that the average of the phases of the second phase signal and the third phase signal is different by 180 degrees from the phase of the first phase signal, which is as shown in FIG. 4. For example, when the first phase signal is the phase signal a having a phase of 0 degrees, the second phase signal and the third phase signal can respectively be the phase signal c having a phase of 144 degrees and the phase signal d having a phase of 216 degrees. As another example, when the first phase signal is the phase signal b having a phase of 72 degrees, the second phase signal and the third phase signal can respectively be the phase signal d having a phase of 216 degrees and the phase signal e having a phase of 288 degrees. An example of the differential amplifier 250 is described below.

Figure 5:
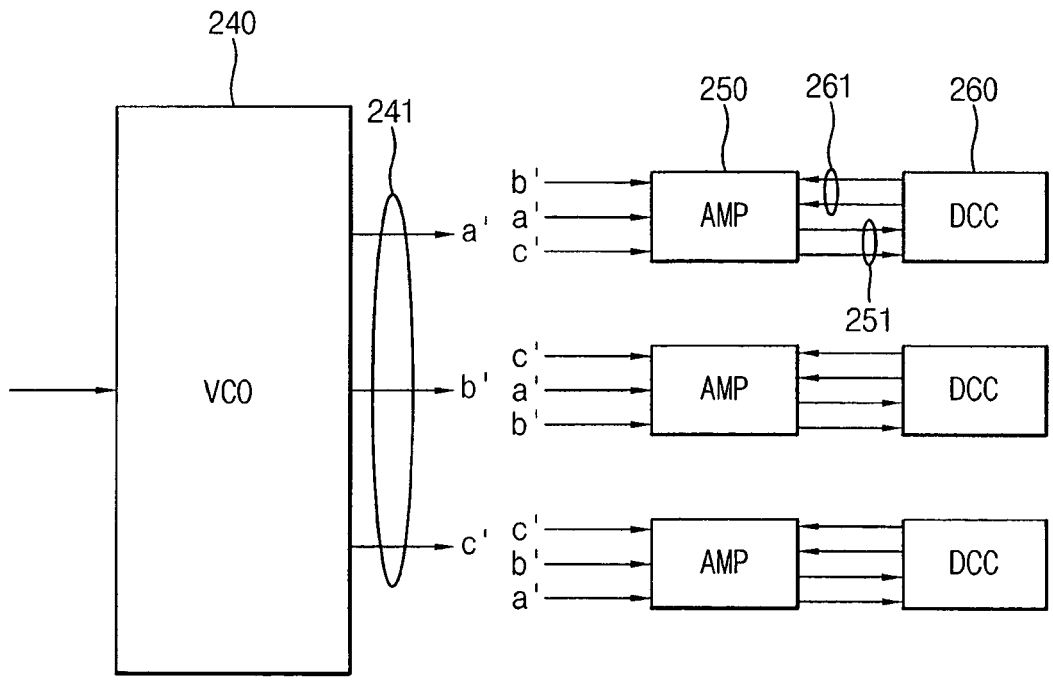
FIG. 5 is a block diagram illustrating an embodiment of a voltage-controlled oscillator that outputs three phase signals according to another aspect of the present invention.
Figure 6:
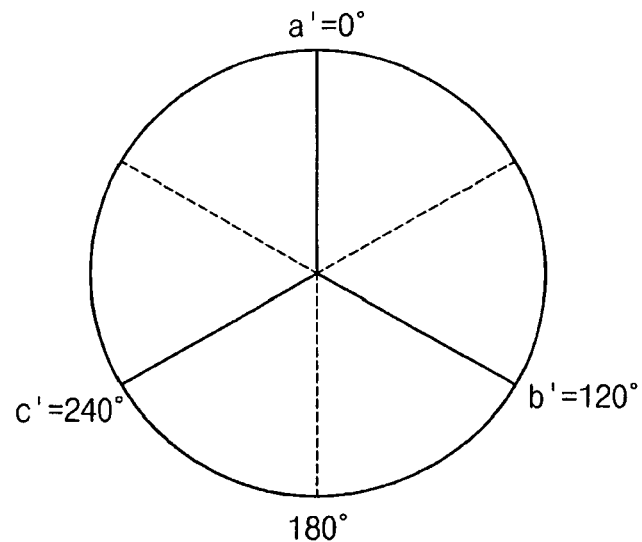
FIG. 6 is a diagram illustrating phases of output signals of the voltage-controlled oscillator in FIG. 5.

FIGS. 5 and 6 are views illustrating a voltage-controlled oscillator that outputs three phase signals.

Referring to FIG. 5, the voltage-controlled oscillator 240 outputs three phase signals "a'," "b'," and "c'" to corresponding differential amplifiers 250. For example, the phase signal a' can have a phase of substantially 0 degrees, the phase signal b' can have a phase of substantially 120 degrees and the phase signal c' can have a phase of substantially 240 degrees.

Each of the differential amplifiers 250 receives and amplifies the three phase signals to output an amplified output signal 251 to the DCC circuit 260. A duty cycle of an output signal 261 of the DCC circuit 260 is corrected, and then the output signal 261 is provided to the differential amplifier 250.

First through third phase signals inputted to the respective differential amplifier 250 are selected such that the average of the phases of the second phase signal and the third phase signal is different by 180 degrees from the phase of the first phase signal, which is shown in FIG. 6. For example, when the first phase signal is the phase signal a' having a phase of 0 degrees, the second phase signal and the third phase signal can respectively be the phase signal b' having a phase of 120 degrees and the phase signal c' having a phase of 240 degrees. In addition, when the first phase signal is the phase signal b' having a phase of 120 degrees, the second phase signal and the third phase signal can respectively be the phase signal c' having a phase of 240 degrees and the phase signal a' having a phase of 0 degrees.

Figure 7:
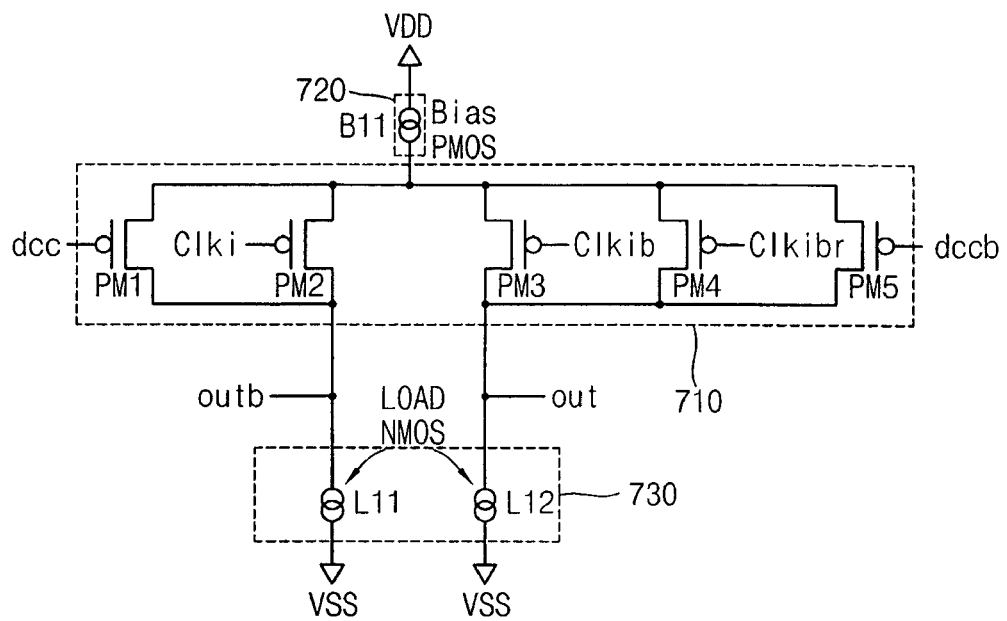
FIG. 7 is a circuit diagram illustrating an embodiment of a CMOS amplifier according to another aspect of the present invention.

FIG. 7 is a circuit diagram illustrating example embodiment of a differential amplifier according to the present disclosure. In the embodiment of FIG. 7, the differential amplifier is a CMOS differential amplifier that includes an input stage 710 including PMOS transistors PM1, PM2, PM3, PM4 and PM5, a PMOS biasing unit 720 including a PMOS transistor B11, and an NMOS load unit 730 including NMOS transistors L11 and L12. The PMOS bias unit 720 is coupled between the input stage 710 and a first power voltage VDD. The NMOS load unit 730 is coupled between the input stage 710 and a second power voltage VSS.

The CMOS differential amplifier receives a first phase signal clki, a second phase signal clkib, a third phase signal clkibr, and first and second output signals dcc and dccb of the DCC circuit 260 respectively through gates of the PMOS transistors PM2, PM3, PM4, PM1 and PM5 to output differential amplified signals out and outb. The first and second output signals dcc and dccb of the DCC circuit 260 are differential outputs of the DCC circuit 260.

Here, an average of phases of the second phase signal clkib and the third phase signal clkibr has a phase difference of 180 degrees from a phase of the first phase signal clki. The two phase signals clkib and clkibr are respectively applied to the gates of the PMOS transistors PM3 and PM4 of the input stage 710 of the CMOS differential amplifier, and thus a phase interpolation is performed thereon. Namely, the average of the phases of the second phase signal clkib and the third phase signal clkibr that are respectively applied to the gates of the PMOS transistors PM3 and PM4 has a phase difference of substantially 180 degrees from the phase of the first phase signal clki inputted to the gate of the PMOS transistor PM2.

Therefore, the CMOS differential amplifier can output the output signals out and outb having a duty cycle of approximately 50:50, which has similar effect as in a case where the CMOS differential amplifier receives two phase signals having a phase difference of substantially 180 degrees from each other. Accordingly, the output signals out and outb having a duty cycle of approximately 50:50 are provided to the DCC circuit 260 and duty corrected by the DCC circuit 260, and thus an output signal of the DCC circuit 260 can have a duty cycle of substantially 50:50.

That is, the CMOS differential amplifier can prevent the duty cycle distortion of the output signal of the DCC circuit 260 that corresponds to the output signal of the CMOS differential amplifier 250, which has a similar effect as in the case where the differential amplifier receives two phase signals having a phase difference of 180 degrees.

FIGS. 8 through 11 are circuit diagrams illustrating other example embodiments of CMOS differential amplifiers according to the present disclosure.

Figure 8:
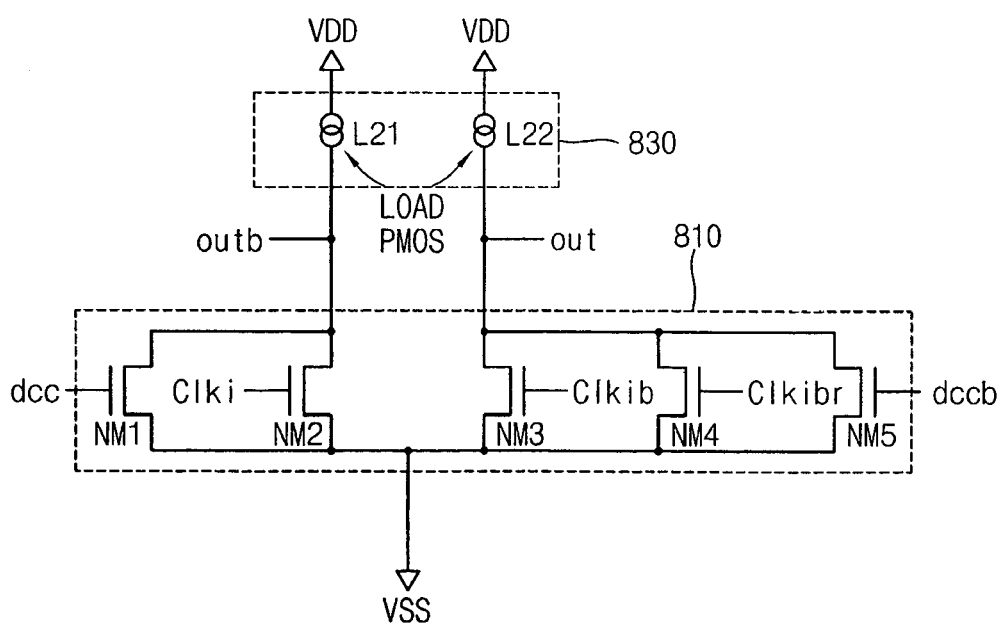
FIGS. 8 through 11 are embodiments of circuit diagrams illustrating CMOS differential amplifiers according to other aspects of the present invention.

The CMOS differential amplifier in FIG. 8 includes an input stage 810 including NMOS transistors NM1, NM2, NM3, NM4 and NM5 and a PMOS load unit 830 including PMOS transistors L21 and L22.

The CMOS differential amplifier in FIG. 8 receives a first phase signal clki, a second phase signal clkib, a third phase signal clkibr, and first and second output signals dcc and dccb of the DCC circuit 260 respectively through gates of the NMOS transistors NM2, NM3, NM4, NM1 and NM5 to output differential amplified signals out and outb.

Figure 9:
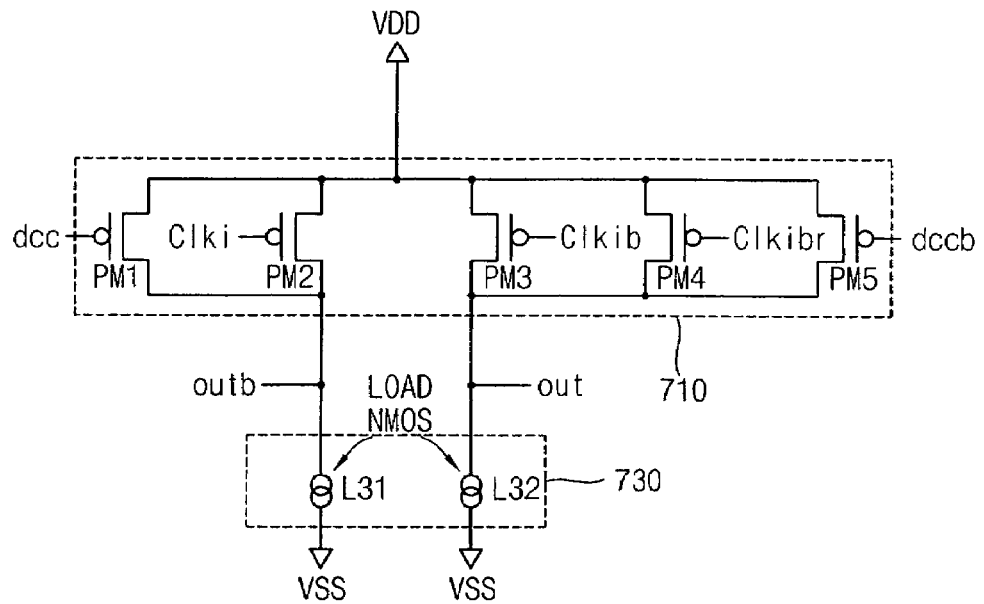

The CMOS differential amplifier in FIG. 9 has a similar configuration to the CMOS differential amplifier in FIG. 7, except a PMOS biasing unit is not included.

Figure 10:
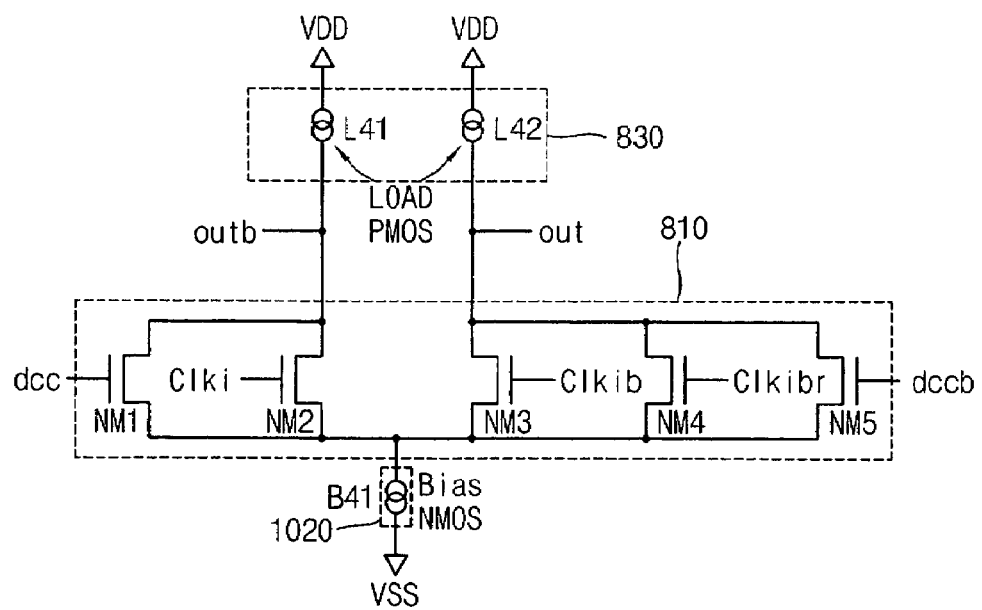

The CMOS differential amplifier in FIG. 10 has a similar configuration to the CMOS differential amplifier in FIG. 8, except for the inclusion of an NMOS biasing unit 1020 having an NMOS transistor B41 in FIG. 10.

Figure 11:
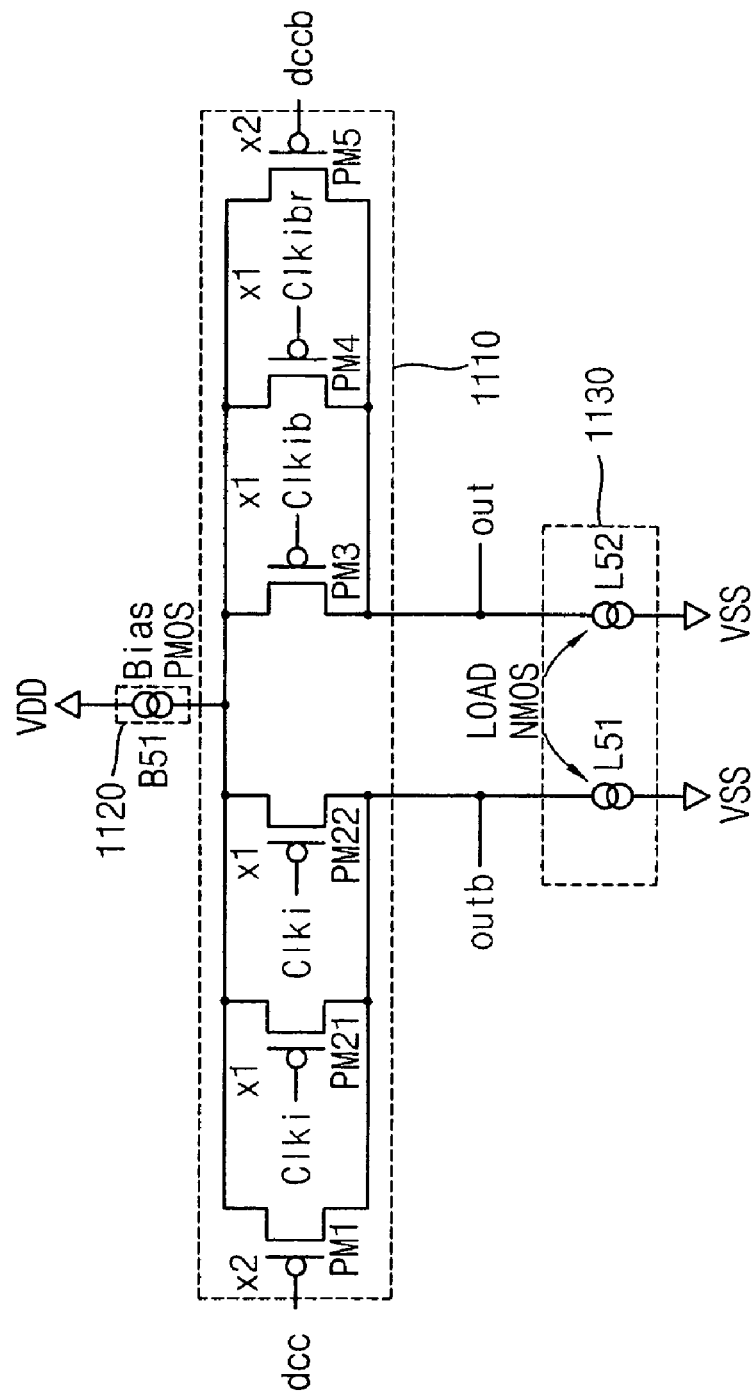

The CMOS differential amplifier in FIG. 11 includes an input stage 1110 including PMOS transistors PM21, PM22, PM3, PM4, PM1 and PM5, a PMOS biasing unit 1120, and an NMOS load unit 1130 including NMOS transistors L51 and L52.

The CMOS differential amplifier in FIG. 11 is different from the CMOS differential amplifier in FIG. 7, additionally including a PMOS transistor PM22 in the input stage 1110. Namely, the CMOS differential amplifier in FIG. 11 receives a first phase signal clki through gates of the two PMOS transistors PM21 and PM22, and receives a second signal clkib and a third phase signal clkibr through the gates of the PMOS transistors PM3 and PM4, respectively. For example, the PMOS transistors PM1, PM21, PM22, PM3, PM4 and PM5 can have a transistor size ratio of 2:1:1:1:1:2.

Therefore, in the CMOS differential amplifier in FIG. 11, six input signals are received by the input stage 1110 in a symmetrical structure to perform to match the size and current of the transistor. It is noted that the input stage 1110 of the CMOS differential amplifier can be alternatively configured to include NMOS transistors, the biasing unit 1120 can be alternatively configured to include an NMOS transistor, and the load unit 1130 can be alternatively configured to include a PMOS transistor.

Figure 12A:
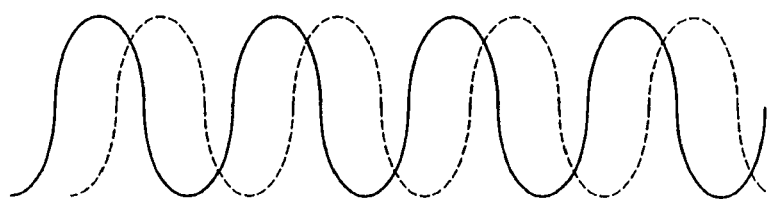
FIG. 12A is a waveform diagram illustrating two signals inputted to an input terminal of a CMOS differential amplifier.
Figure 12B:
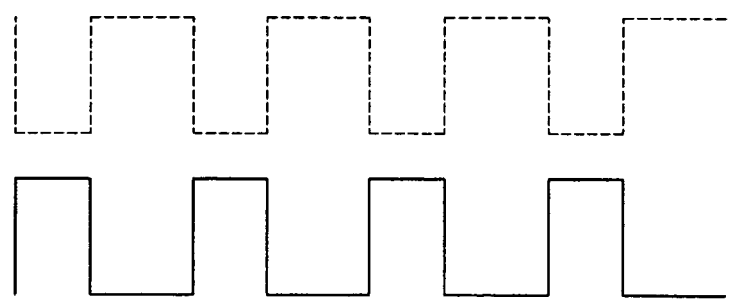
FIG. 12B is a waveform diagram illustrating an output signal of the conventional CMOS amplifier in FIG. 1 when the CMOS amplifier receives the signals in FIG. 12A.
Figure 12C:
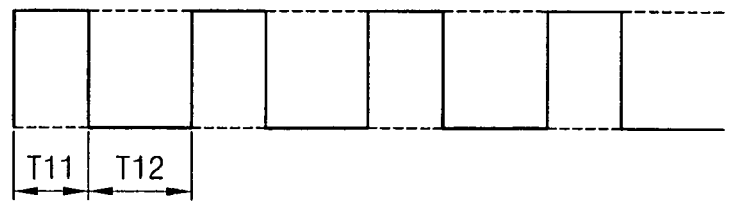
FIG. 12C is a graph illustrating a duty cycle of a duty cycle correction (DCC) circuit when the CMOS amplifier in FIG. 1 receives the signals in FIG. 12A.

FIG. 12A is a waveform diagram illustrating two signals inputted to an input terminal of a CMOS differential amplifier, wherein the two signals do not have a phase difference of 180 degrees. FIG. 12B is a waveform diagram illustrating an output signal of the conventional CMOS amplifier in FIG. 1 when the two signals in FIG. 12A are inputted to the CMOS amplifier in FIG. 1. FIG. 12C is a graph illustrating a duty cycle of an output signal of a DCC circuit when the two signals in FIG. 12A are inputted to the CMOS amplifier in FIG. 1.

As shown in FIG. 12C, although the duty cycle of the output signal of the DCC circuit 30 is corrected by the DCC circuit 30, the duty cycle T11:T12 of the output signal of the DCC circuit 30 does not exhibit 50:50.

Figure 13A:
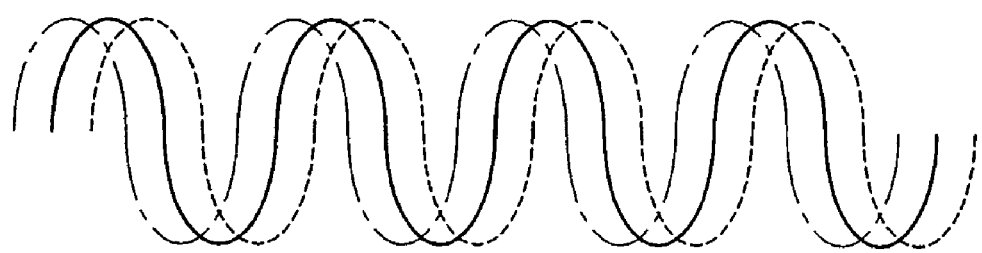
FIG. 13A is a waveform diagram illustrating first through third phase signals inputted to an embodiment of a CMOS differential amplifier according to aspects of the present invention.
Figure 13B:
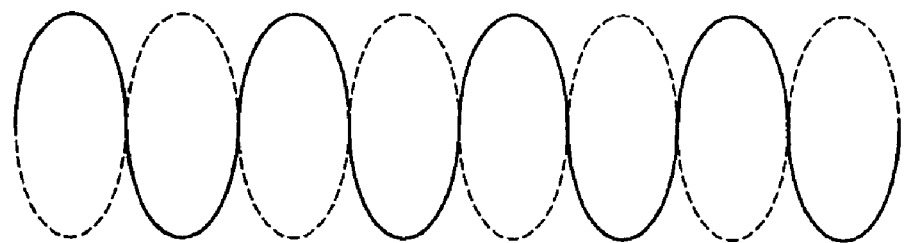
FIG. 13B is a waveform diagram illustrating phase output signals of an embodiment of a CMOS amplifier according to aspects of the present invention, when the CMOS amplifier receives the first through third phase signals in FIG. 13A.
Figure 13C:
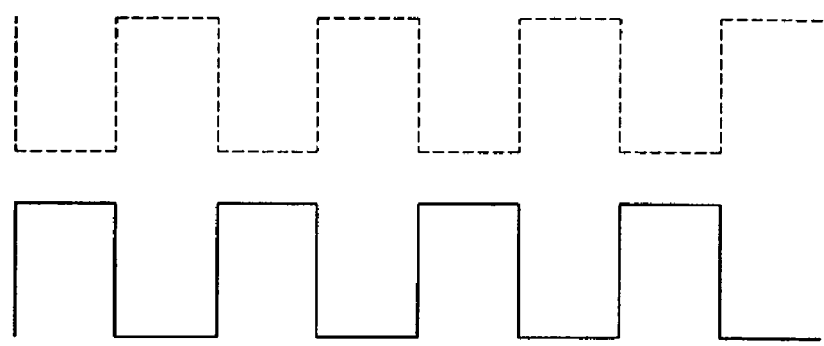
FIG. 13C is a waveform diagram illustrating an output signal of an embodiment of a CMOS amplifier according to aspects of the present invention, when the CMOS amplifier receives the first through third phase signals in FIG. 13A.
Figure 13D:
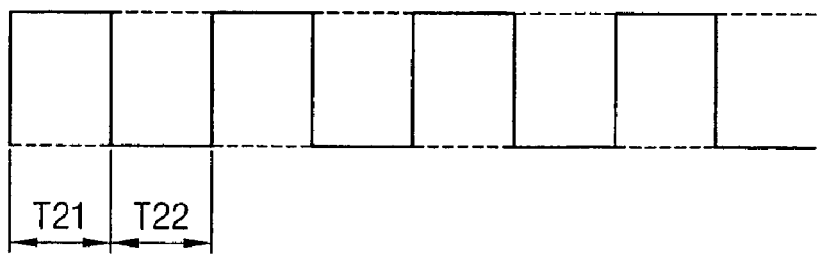
FIG. 13D is a graph illustrating a duty cycle of an output signal of a DCC circuit when an embodiment of a CMOS amplifier according to aspects of the present invention, when the CMOS amplifier receives the first through third phase signals in FIG. 13A on an input terminal.

FIG. 13A is a waveform diagram illustrating first through third phase signals inputted to a CMOS differential amplifier according to the present disclosure, for example, one of the CMOS differential amplifiers of FIGS. 7-11. FIG. 13B is a waveform diagram illustrating phase signals having a phase difference of substantially 180 degrees of a CMOS amplifier according to an example embodiment of the present disclosure, when the CMOS amplifier receives the first through third phase signals in FIG. 13A. FIG. 13C is a waveform diagram illustrating an output signal of the CMOS amplifier when the first through third phase signals in FIG. 13A are inputted to the CMOS amplifier. FIG. 13D is a graph illustrating a duty cycle of an output signal of a DCC circuit 260 when the first through third phase signals in FIG. 13A are inputted to the CMOS amplifier.

As shown in FIG. 13D, the duty cycle T21:T22 of the output signal of the DCC circuit 260, when corrected by the DCC circuit 260, is 50:50 (i.e. 50%).

Figure 14A:
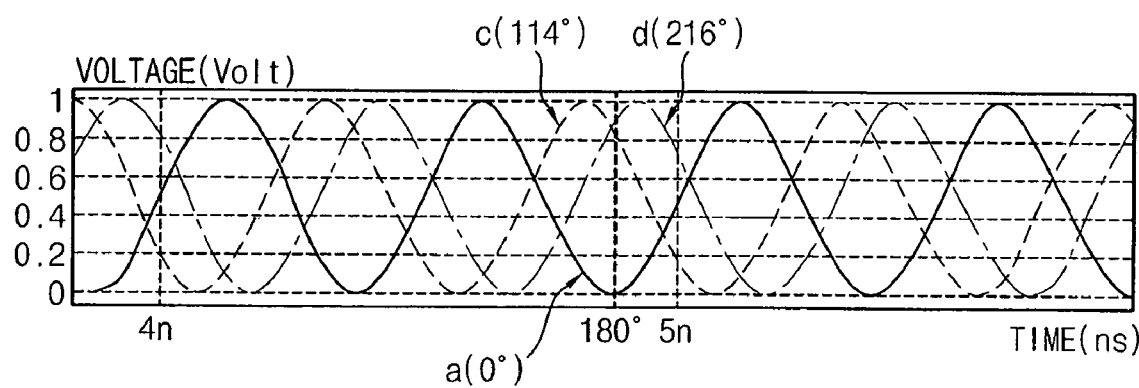
FIG. 14A is a waveform diagram illustrating a simulation result of first through third phase signals that are inputted to an embodiment of a CMOS differential amplifier according to aspects of the present invention.
Figure 14B:
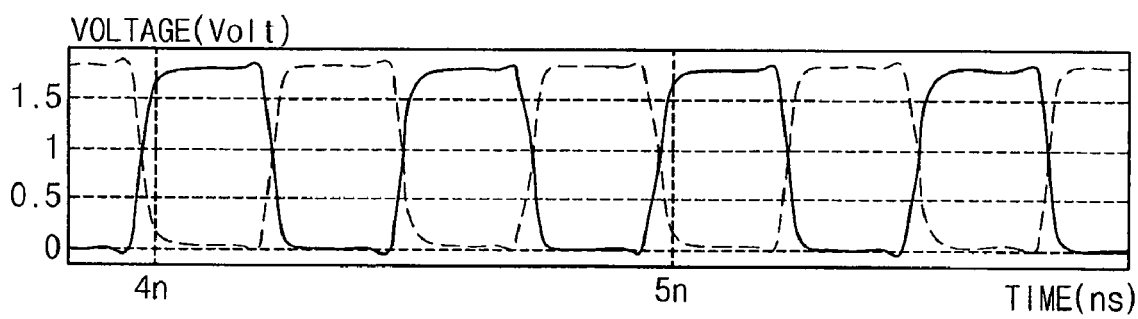
FIG. 14B is a waveform diagram illustrating a simulation result of an output signal of an embodiment of a CMOS differential amplifier according to aspects of the present invention, when the first through third phase signals in FIG. 14A are inputted to the CMOS differential amplifier.

FIG. 14A is a waveform diagram illustrating a simulation result of first through third phase signals a, c and d that are inputted to a CMOS differential amplifier according to the present disclosure. FIG. 14B is a waveform diagram illustrating a simulation result of an output signal of the CMOS differential amplifier when the first through third phase signals a, c and d in FIG. 14A are inputted to the CMOS differential amplifier. As shown in FIG. 14B, the output signal of the CMOS differential amplifier according to an example embodiment of the present invention has a duty cycle of substantially 50:50. Therefore, the output signal of the DCC circuit 260 can have a duty cycle of 50:50.

Figure 15:
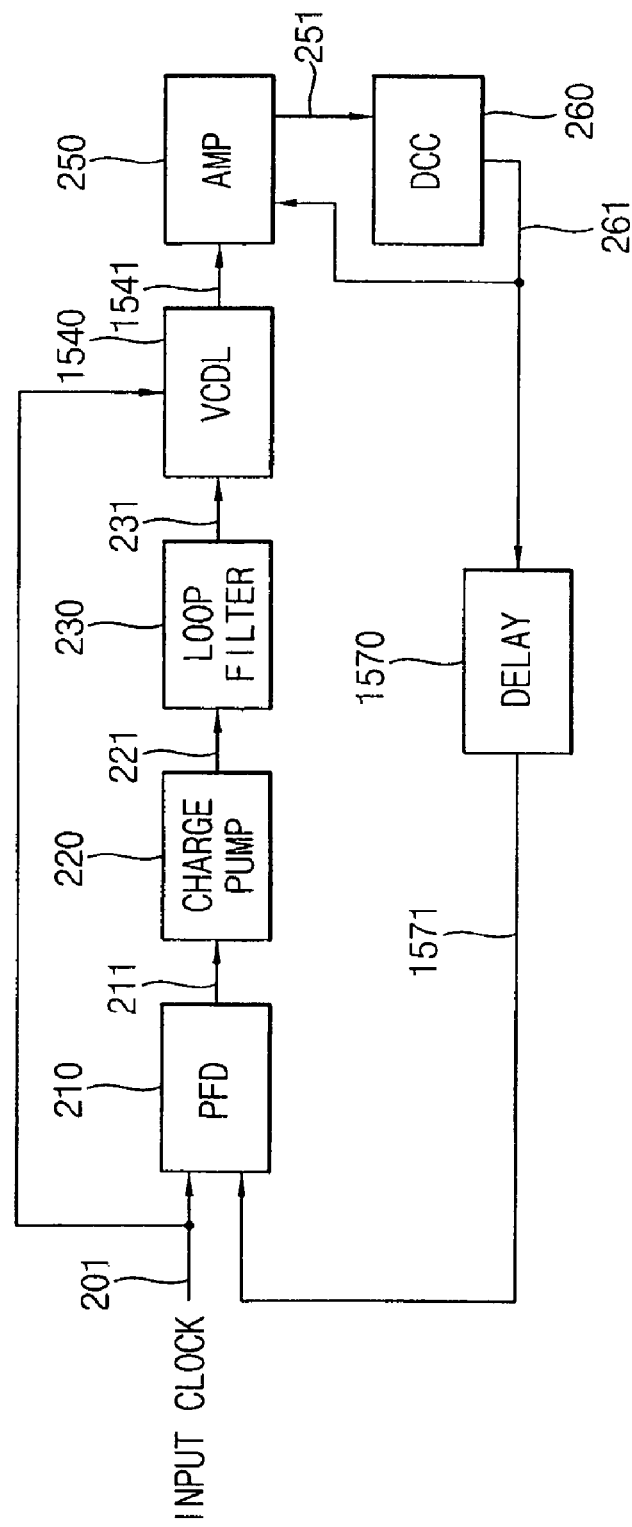
FIG. 15 is a block diagram illustrating an embodiment of a delayed locked loop (DLL) according to aspects of the present invention.

FIG. 15 is a block diagram illustrating a delayed locked loop (DLL) apparatus or circuit according to an example embodiment of the present invention.

Referring to FIG. 15, the DPP includes a phase frequency detector (PFD) 210, a charge pump 220, a loop filter 230, a voltage-controlled delay line (VCDL) 1540 and a delayer 1570.

The phase frequency detector 210 compares a phase of an input signal 201 and a phase of a feedback signal 1571 to generate a phase difference signal 211 containing information on a phase difference between the input signal 201 and the feedback signal 1571. The phase difference signal 211 can be an up signal (UP) or a down signal (DN) of the charge pump 220.

The charge pump 220 generates a current signal 221 based on the phase difference between the input signal 201 and the feedback signal 1571 using the phase difference signal 211 provided from the PFD 210. The loop filter 230 generates a control voltage signal 231 based on the current signal 221.

The voltage-controlled delay line (VCDL). 1540 generates a plurality of delay signals 1541 by delaying the input signal 201 by a predetermined interval based on the control voltage signal 231. The plurality of the delay signals 1541 can include odd-numbered delay signals, for example, three, five or seven delay signals having different phases from one another.

The DLL can further include a differential amplifier 250 and a duty cycle correction (DCC) circuit 260. For example, the differential amplifier 250 can be a CMOS differential amplifier. The differential amplifier 250 receives and differentially amplifies first through third phase signals among the plurality of the delay signals 1541 to convert the delay signals 1541 to a signal having a level used in a CMOS circuit. The first through third phase signals inputted to the differential amplifier 250 are selected such that the average of the phases of the second phase signal and the third phase signal is different by 180 degrees from the phase of the first phase signal, as already described in the example embodiments in FIG. 4 and FIG. 6.

The differential amplifier 250 in FIG. 15 can have any one of configurations similar or substantially similar to the differential amplifier illustrated in the example embodiments in FIGS. 7 through 11.

An output signal 251 of the differential amplifier 250 is provided to the DCC circuit 260, and then the duty cycle of the output signal 251 is corrected to 50:50.

The delayer 1570 is used to delay an output signal 261 of the DCC circuit 260 by a predetermined interval to provide a feedback signal 1571 to the phase frequency detector 210.

According to the differential amplifier, differential amplifying method and the phase locked loop and the delay locked loop using the same, as described above, first through third phase signals among odd-numbered phase signals outputted from the voltage-controlled oscillator (VCO) of the PLL or the voltage-controlled delay line (VCDL) of the DLL are inputted to an input stage of the differential amplifier. The first through third phase signals inputted to the differential amplifier 250 are selected such that the average of the phases of the second phase signal and the third phase signal is different by 180 degrees from the phase of the first phase signal.

As a result, the differential amplifier can generate an output signal having a duty cycle approximately 50:50 (i.e., 50%). Therefore, when the output signals having a duty cycle of approximately 50:50 are provided to the DCC circuit and duty corrected by the DCC circuit, the output signal of the DCC circuit can have a duty cycle of substantially 50:50, and thus a duty cycle distortion of the output signal of the DCC circuit can be prevented.

Having thus described example embodiments of the present invention, it is to be understood that the invention defined by the appended claims is not to be limited by particular details set forth in the above description as many apparent variations thereof are possible without departing from the spirit or scope thereof as hereinafter claimed. It is intended by the following claims to claim that which is literally described and all equivalents thereto, including all modifications and variations that fall within the scope of each claim.

What is claimed is:

1. A differential amplifier comprising:
   an input stage configured to receive a first phase signal and at least two phase signals among a set of odd-numbered phase signals, wherein an average of phases of the at least two phase signals has a phase difference of substantially 180 degrees from the first phase signal;

a biasing unit coupled between the input stage and a first power voltage; and
a load unit coupled between the input stage and a second power voltage, the load unit configured to output first and second differential output signals based on differentially amplifying the first phase signal and the at least two phase signals, respectively.

2. The differential amplifier of claim 1, wherein the differential amplifier is a CMOS differential amplifier.

3. The differential amplifier of claim 2, wherein the CMOS differential amplifier forms part of a phase locked loop (PLL) circuit.

4. The differential amplifier of claim 3, wherein the PLL circuit includes a voltage controlled oscillator and the set of odd-numbered phase signals are output signals from the voltage-controlled oscillator.

5. The differential amplifier of claim 2, wherein the CMOS differential amplifier forms part of a delay locked loop (DLL) circuit.

6. The differential amplifier of claim 5, wherein the DLL circuit includes a voltage controlled delay line and the set of odd-numbered phase signals are output signals from the voltage-controlled delay line.

7. The differential amplifier of claim 1, wherein the at least two phase signals include a second phase signal and a third phase signal, and wherein the input stage comprises:
a first transistor configured to receive the first phase signal;
a second transistor configured to receive the second phase signal; and
a third transistor configured to receive the third phase signal.

8. The differential amplifier of claim 7, wherein the input stage further comprises:
a fourth transistor configured to receive a first output signal of a duty cycle correction circuit; and
a fifth transistor configured to receive a second output signal of the duty cycle correction circuit.

9. The differential amplifier of claim 8, wherein the input stage further comprises a sixth transistor configured to receive the first phase signal.

10. The differential amplifier of claim 7, wherein a phase difference between two adjacent phase signals among the set of odd-numbered phase signals is a value obtained by dividing 360 degrees by a number of phase signals in the set of odd-numbered signals, and wherein phases of the second phase signal and the third phase signal are two closest phases to a phase obtained by adding 180 degrees to a phase of the first phase signal.

11. A differential amplifier configured to amplify a first phase signal and at least two phase signals among a set of odd-numbered phase signals, wherein an average of phases of the at least two phase signals has a phase difference of substantially 180 degrees from the first phase signal, and configured to output first and second differential output signals based on amplifying the first phase signal and the at least two phase signals, respectively.

12. The differential amplifier of claim 11, wherein the differential amplifier is a CMOS differential amplifier.

13. The differential amplifier of claim 11, wherein the at least two phase signals comprise a second phase signal and a third phase signal, and wherein the differential amplifier comprises an input stage having first, second and third transistors respectively configured to receive the first, second and third phase signals.

14. The differential amplifier of claim 13, wherein a phase difference between two adjacent phase signals among the set of odd-numbered phase signals is a value obtained by dividing 360 degrees by the number of phase signals in the set of odd numbered phase signals, and wherein phases of the second and third phase signals are two closest phases to a phase obtained by adding 180 degrees to a phase of the first phase signal.

15. A phase locked loop apparatus comprising:
a phase frequency detector configured to generate a phase difference signal based on a phase difference between an input signal and a feedback signal;
a charge pump configured to generate a current signal based on the phase difference signal of the phase frequency detector;
a loop filter configured to generate a control voltage signal based on the current signal;
a voltage-controlled oscillator configured to generate a plurality of phase signals having frequencies that vary according to a voltage level of the control voltage signal;
a differential amplifier configured to amplify a first phase signal and at least two phase signals among the plurality of the phase signals, wherein an average of phases of the at least two phase signals has a phase difference of substantially 180 degrees from the first phase signal;
a duty cycle correction circuit configured to correct a duty cycle of an output signal of the differential amplifier; and
a frequency divider configured to generate the feedback signal by dividing an output signal of the duty cycle correction circuit with a predetermined ratio.

16. The phase locked loop apparatus of claim 15, wherein the differential amplifier is a CMOS differential amplifier, and wherein the plurality of phase signals is a set of odd-numbered phase signals.

17. The phase locked loop apparatus of claim 16, wherein the at least two phase signals include a second phase signal and a third phase signal, and wherein the differential amplifier includes an input stage having first, second and third transistors respectively receiving the first, second and third phase signals.

18. The phased locked loop apparatus claim 16, wherein the differential amplifier is configured so that a phase difference between two adjacent phase signals among the set of odd-numbered phase signals is a value obtained by dividing 360 degrees by the number of phase signals in the set of odd-numbered signals, and wherein phases of the second phase signal and third phase signal are two closest phases to a phase obtained by adding 180 degrees to a phase of the first phase signal.

19. A delay locked loop apparatus comprising:
a phase frequency detector configured to generate a phase difference signal based on a phase difference between an input signal and a feedback signal;
a charge pump configured to generate a current signal based on the phase difference signal of the phase frequency detector;
a loop filter configured to generate a control voltage signal based on the current signal;
a voltage-controlled delay line configured to generate a plurality of delay signals by delaying the input signal by a predetermined interval based on the control voltage signal;
a differential amplifier configured to amplify a first phase signal and at least two phase signals among the plurality of the delay signals, wherein an average of phases of the at least two phase signals has a phase difference of substantially 180 degrees from the first phase signal;
a duty cycle correction circuit configured to correct a duty cycle of an output signal of the differential amplifier; and a delayer configured to generate the feedback signal by delaying an output signal of the duty cycle correction circuit.

20. A differential amplifying method comprising:
receiving a first phase signal and at least two phase signals among a set of odd-numbered phase signals, wherein an average of phases of the at least two phase signals has a phase difference of substantially 180 degrees from the first phase signal;
outputting first and second differentially amplified output signals based on differentially amplifying the first phase signal and the at least two phase signals, respectively; and
correcting a duty cycle of the differentially amplified output signal.

21. A differential amplifier comprising:
an input stage configured to receive a first phase signal and at least two phase signals among a set of odd-numbered phase signals, wherein an average of phases of the at least two phase signals has a phase difference of substantially 180 degrees from the first phase signal;
a biasing unit coupled between the input stage and a first power voltage; and
a load unit coupled between the input stage and a second power voltage, the, load unit configured to output a differential output signal based on differentially amplifying the first phase signal and the at least two phase signals;
wherein the at least two phase signals include a second phase signal and a third phase signal, and wherein the input stage comprises:
a first transistor configured to receive the first phase signal;
a second transistor configured to receive the second phase signal;
a third transistor configured to receive the third phase signal;
a fourth transistor configured to receive a first output signal of a duty cycle correction circuit; and
a fifth transistor configured to receive a second output signal of the duty cycle correction circuit.

22. The differential amplifier of claim 21, wherein the input stage further comprises a sixth transistor configured to receive the first phase signal.

23. A differential amplifier comprising:
an input stage configured to receive a first phase signal and at least two phase signals among a set of odd-numbered phase signals, wherein an average of phases of the at least two phase signals has a phase difference of substantially 180 degrees from the first phase signal;
a biasing unit coupled between the input stage and a first power voltage; and
a load unit coupled between the input stage and a second power voltage, the load unit configured to output a differential output signal based on differentially amplifying the first phase signal and the at least two phase signals;
wherein the at least two phase signals include a second phase signal and a third phase signal, and wherein the input stage comprises:
a first transistor configured to receive the first phase signal;
a second transistor configured to receive the second phase signal; and
a third transistor configured to receive the third phase signal;
wherein a phase difference between two adjacent phase signals among the set of odd-numbered phase signals is a value obtained by dividing 360 degrees by a number of phase signals in the set of odd-numbered signals, and wherein phases of the second phase signal and the third phase signal are two closest phases to a phase obtained by adding 180 degrees to a phase of the first phase signal.

24. A differential amplifier configured to amplify a first phase signal and at least two phase signals among a set of odd-numbered phase signals, wherein an average of phases of the at least two phase signals has a phase difference of substantially 180 degrees from the first phase signal; and
wherein the at least two phase signals comprise a second phase signal and a third phase signal, and wherein the differential amplifier comprises an input stage having first, second and third transistors respectively configured to receive the first, second and third phase signals, and
wherein a phase difference between two adjacent phase signals among the set of odd-numbered phase signals is a value obtained by dividing 360 degrees by the number of phase signals in the set of odd numbered phase signals, and wherein phases of the second and third phase signals are two closest phases to a phase obtained by adding 180 degrees to a phase of the first phase signal.

* * * * *